United States Patent [19]

Maroney, III et al.

[11] Patent Number: 5,343,054
[45] Date of Patent: Aug. 30, 1994

[54] SEMICONDUCTOR LIGHT-DETECTION DEVICE WITH RECOMBINATION RATES

[75] Inventors: James T. Maroney, III; Hideto Furuyama, both of Yokohama, Japan

[73] Assignee: Kabushiki Kaisha Toshiba, Kawasaki, Japan

[21] Appl. No.: 120,410

[22] Filed: Sep. 14, 1993

[30] Foreign Application Priority Data

Sep. 14, 1992 [JP] Japan .................................. 4-271206

[51] Int. Cl.$^5$ ............................................. H01L 27/14
[52] U.S. Cl. .................................. 257/184; 257/187; 257/453; 257/462
[58] Field of Search ............... 257/458, 462, 438, 186, 257/187, 188, 184, 453

[56] References Cited

U.S. PATENT DOCUMENTS 4,620,210 10/1986 Scavennec et al. .................. 257/463

FOREIGN PATENT DOCUMENTS

| 55-39643 | 3/1980 | Japan | 257/462 |
| 56-80179 | 7/1981 | Japan | 257/184 |
| 61-46080 | 3/1986 | Japan | 257/187 |
| 0639163 | 1/1988 | Japan | 257/187 |

OTHER PUBLICATIONS

Campbell et al., "Heterojunction Phototransistors for Long-Wavelength Optical Receivers," *J. Appl. Phys.* 53(2), Feb. 1982, pp. 1203–1208.

Ünlü et al, "Resonant Cavity Enhanced AlGaAs/GaAs Heterojunction Phototransistors with an Intermediate InGaAs Layer in the Collector," *Appl. Phys. Lett.* 57(8), Aug. 20, 1990, pp. 750–752.

Leu et al, "High Sensitivity $In_{0.53}Ga_{0.47}As$/InP Heterojunction Phototransistors," *Appl. Phys. Lett.* 57(12), Sep. 17, 1990, pp. 1251–1253.

"Demonstration of Novel Quantum Well Gate Controlled Photodetector Switch," J. M. Xu, et al., Electronics Letters, Feb. 27, 1992 vol. 28, No. 5 pp. 501–503.

"Wavelength Discriminating Optical Switch," IEEE Transactions on Photonics Technology Letters, vol. 3, No. 12; M. S. Unlu; Dec., 1991 pp. 1126–1129.

"Demonstration of High Performance Heterojunction Field Effect Transistor in InAlAs/InGaAs/InAlGaAs/InP Material System," Electronics Letters, vol. 27, No. 16, R. S. Mand and J. G. Simmons; Aug. 1, 1991, pp. 1453–1454.

*Primary Examiner*—William Mintel
*Attorney, Agent, or Firm*—Oblon, Spivak, McClelland, Maier & Neustadt

[57] ABSTRACT

According to this invention, a phototransistor includes an n-type InP emitter layer formed on an n$^+$-type InP substrate, a p$^-$-type InGaAsP base layer, and a light-absorbing n$^-$-type InGaAsP collector layer. An undoped InGaAs multiple quantum well layer is interposed between the emitter and base layers. An emitter electrode is in contact with the substrate, and a collector electrode is in contact with an n$^+$-type InP cap layer for covering the collector layer. A reverse bias voltage is applied across the emitter and collector electrodes. The rate at which electrons injected from the emitter layer to the quantum well layer and holes injected from the collector layer to the quantum well layer are combined with each other and disappear in a state wherein detection light is not incident is higher than that in a state wherein the detection light is incident. For this reason, a digital output signal can be directly obtained from the transistor action of this invention.

14 Claims, 9 Drawing Sheets

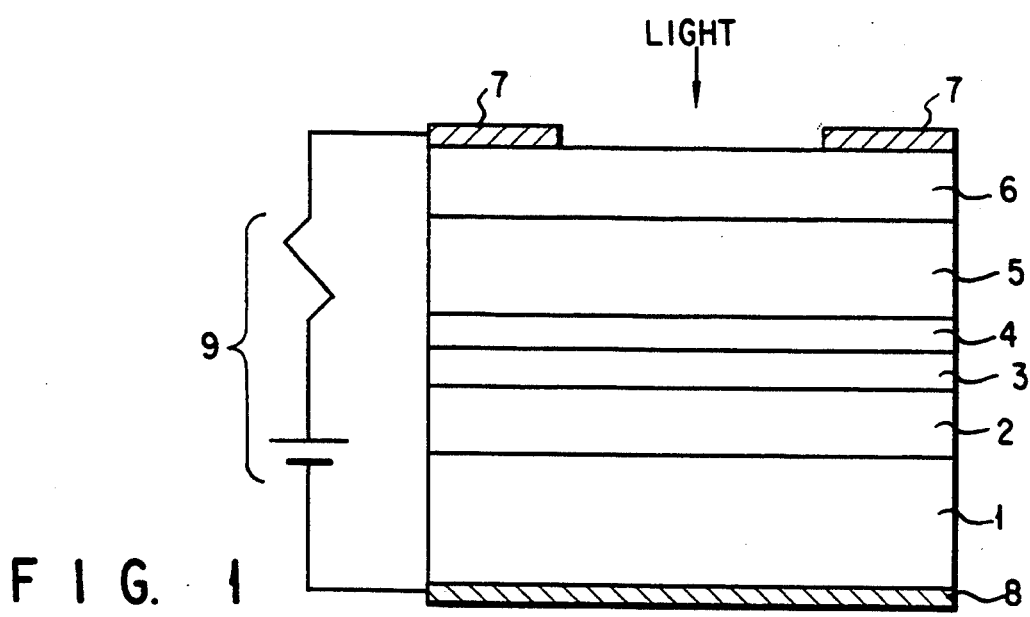
F I G. 1
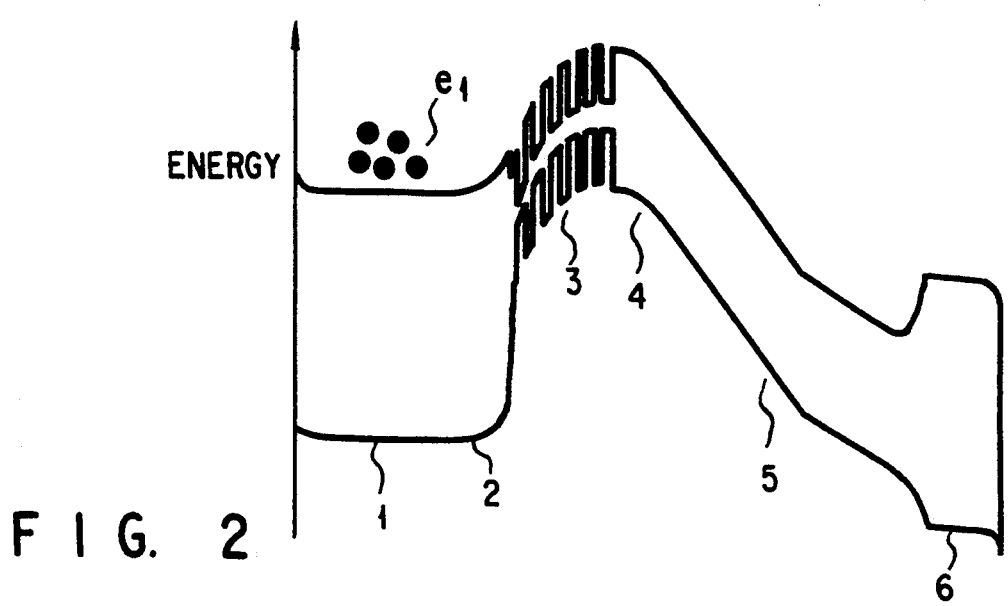
F I G. 2
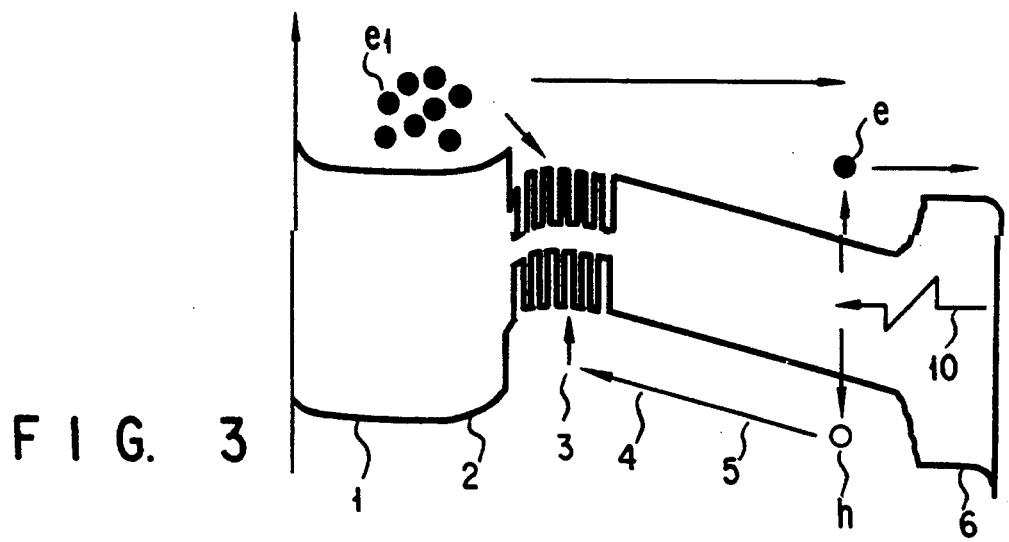
F I G. 3

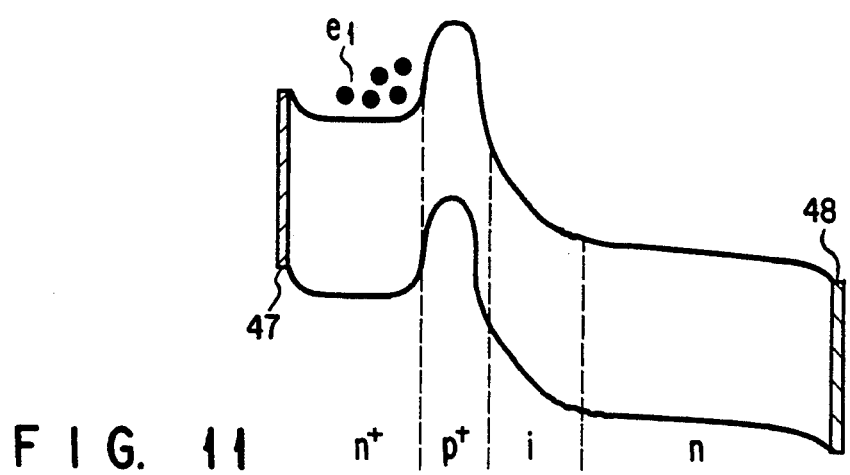
F I G. 11
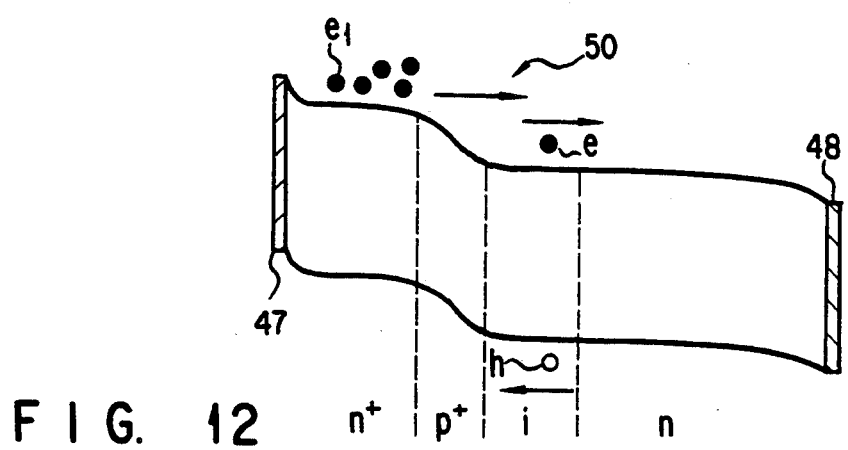
F I G. 12
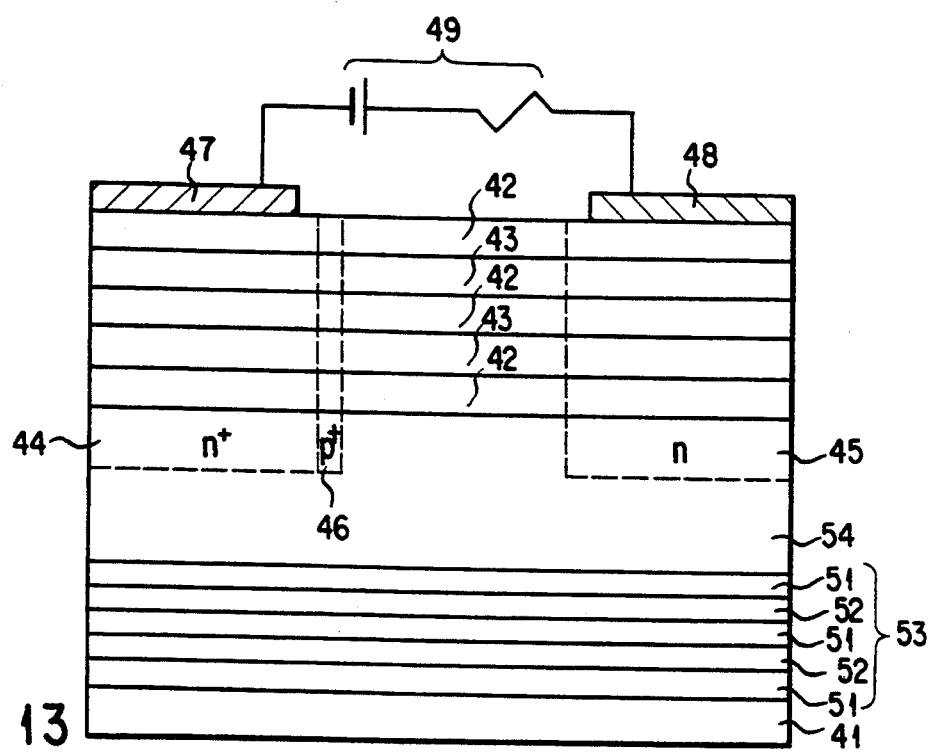
F I G. 13

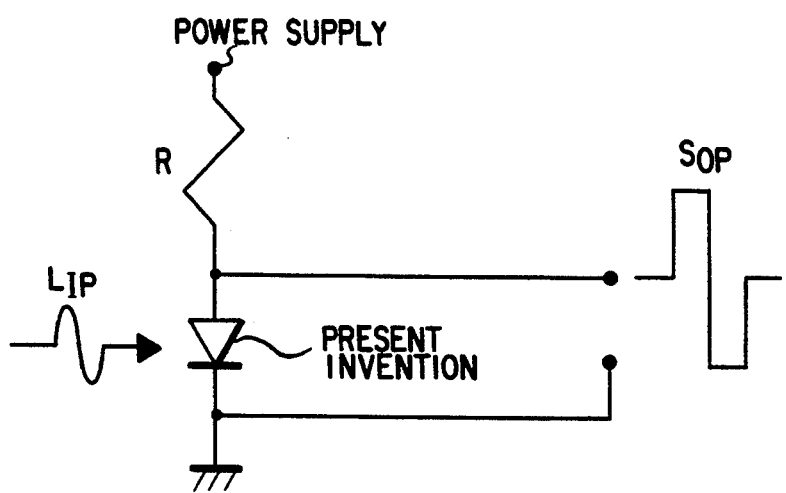
F I G. 21
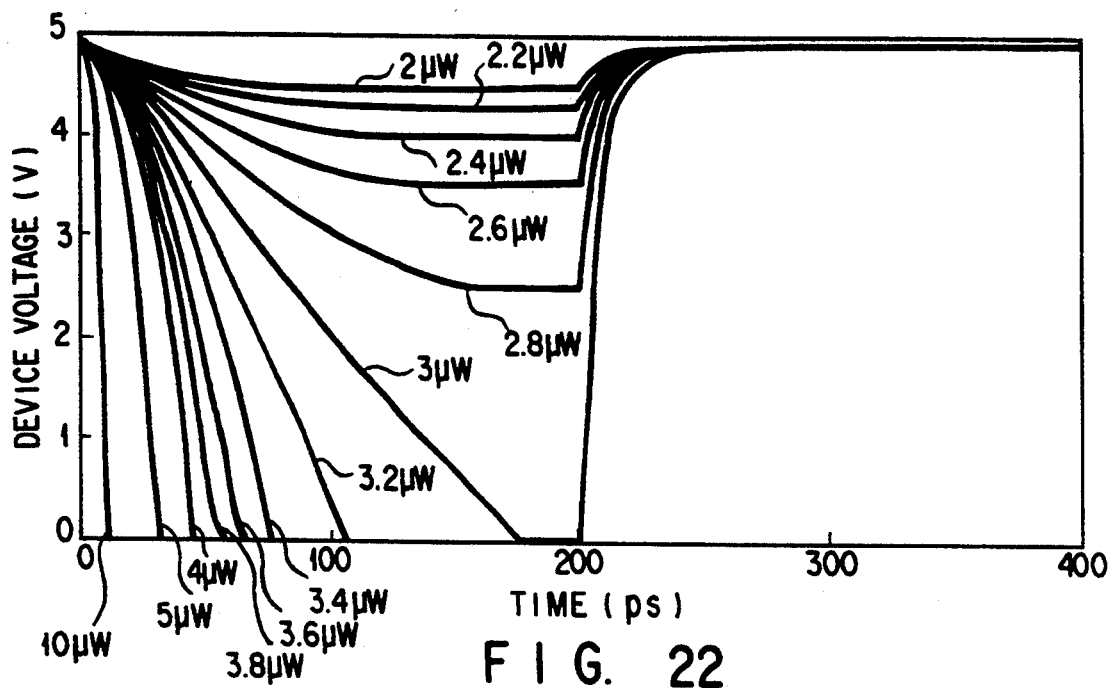
F I G. 22

SEMICONDUCTOR LIGHT-DETECTION DEVICE WITH RECOMBINATION RATES

BACKGROUND OF THE INVENTION

1. Field of the Invention

The present invention relates to a semiconductor light-detecting device such as a phototransistor for converting an optical signal into an electrical signal.

2. Description of the Related Art

The research and development of digital optical communication techniques is intensifying because optical signal transmission is superior to electrical signal transmission with respect to transmission speed and elimination of interference between signals. However, a practical device capable of direct conversion of an optical signal into a digital electrical signal has not yet been developed. That is, the following processes must be performed: after an optical signal is converted into an electrical signal, the electrical signal must be amplified by an amplifier and then converted into a digital signal by an A/D (analog/digital) converter.

Photoconductors, photodiodes, avalanche photodiodes, phototransistors, and the like are conventionally used as photodetection devices.

The photoconductor is a device for extracting a current using an effect (photoconductive effect) in which an electric resistance is decreased by irradiation of light. An MSM (Metal Semiconductor Metal) photoconductor shown in FIG. 17 is widely known. In FIG. 17, reference numeral 71 denotes a semiconductor substrate, and reference numerals 72 denote electrodes (anode and cathode electrodes).

A photoconductor cannot have current gain, but can have a high quantum conversion efficiency. However, an increase in the quantum conversion efficiency unavoidably reduces the frequency bandwidth, or range, of the device. This is consequential to the requirement of space charge neutrality within the device. After pairs of electrons and holes are generated by incident light, when a voltage is applied to the photoconductor by an external circuit, the holes and electrons flow toward the anode and cathode electrodes, respectively. The traveling or transit time of the holes is longer than that of the electrons, especially in III-V group compound semiconductors. In order to maintain internal charge neutralization, electrons are injected continuously from the external circuit until the holes either are recombined with the electrons or reach the anode electrode.

The quantum conversion efficiency of the device is determined by the ratio of the mean transit time of holes to the mean transit time of electrons. By prolonging the mean transit time of holes, a high quantum conversion efficiency can be equivalently obtained. In this case, however, the frequency range of the device is disadvantageously narrowed. In this manner, the conventional photoconductor cannot simultaneously have a high quantum conversion efficiency and a wide frequency range.

FIG. 18 is a sectional view showing a conventional pin photodiode.

This pin photodiode has a structure obtained by stacking an n-type semiconductor layer 81, an intrinsic (i-type) semiconductor light-absorbing layer 82, and a p-type semiconductor layer 83. In FIG. 18, reference numerals 84 and 85 denote an anode electrode and a cathode electrode, respectively.

The pin photodiode does not have current gain, but has a frequency range wider than that of a conventional photoconductor. The quantum conversion efficiency of the pin photodiode cannot exceed 100%, and external gain is required to obtain a high voltage output.

In contrast to this, an avalanche photodiode has a frequency range almost equal to the frequency range of a conventional pin photodiode, and has current gain ($\cong 10$). However, a power supply voltage sufficient to cause avalanche breakdown is required to obtain current gain, and a carrier multiplication time for obtaining an avalanche gain is required. For this reason, high gain results in decreased frequency range.

FIG. 19 is a sectional view showing a conventional phototransistor.

This phototransistor 90 has a structure in which a p-type semiconductor layer 92 is formed by diffusion in an n-type semiconductor light-absorbing collector layer 91, and an n-type semiconductor layer 93 is formed by diffusion in the p-type semiconductor layer 92. In FIG. 19, reference numerals 94, 95, and 96 denote an emitter electrode, a collector electrode, and a power supply, respectively.

A current flowing between the n-type semiconductor light-absorbing collector layer 91 and the n-type semiconductor layer 93 is controlled by injecting carriers generated within the n-type semiconductor light-absorbing collector layer 91 into the p-type semiconductor layer 92. Although the phototransistor can have a relatively high current gain ($\cong 100$), the speed of the current is disadvantageously decreased due to a carrier accumulation effect of a base region, causing the frequency range of the device to be reduced. The device thus cannot simultaneously have high current gain and wide frequency range.

An output from the device is linear with respect to an optical input $L_{IP}$, and an A/D conversion process must be still performed to obtain a digital output signal. Because the external circuit cannot easily be replaced with an electrical digital switch, when the device 90 is to be used, as shown in FIG. 20, after the optical input $L_{IP}$ is converted into an electrical signal, the electrical signal is amplified by an amplifier 97, and the amplified signal is converted into a digital output signal $S_{OP}$ by an A/D (analog/digital) converter 98.

SUMMARY OF THE INVENTION

It is, therefore, an object of the present invention to provide a semiconductor light-detecting device capable of directly reproducing a digital signal without using either an amplifier or an A/D converter.

According to the present invention, there is provided a semiconductor device comprising:

a first layer consisting of a semiconductor of a first conductivity type, a semiconductor recombination layer, joined to the first layer, for controlling a recombination rate of carriers, a second layer consisting of a semiconductor of a second conductivity type and joined to the recombination layer on a side opposite to the first layer, a third layer consisting of a semiconductor of the first conductivity type or an intrinsic semiconductor and joined to the second layer on a side opposite to the recombination layer, the third layer operating as a layer for absorbing detection light, a first electrode connected to the first layer, a second electrode connected to the third layer, and a power supply for applying a bias voltage across the first and second electrodes, wherein a rate at which carriers of a first polarity injected from the first layer to the recombination layer and carriers of a second polarity injected from the third layer to the recombination layer are recombined with each other and disappear in a state wherein the detection light is not incident is higher than that in a state wherein the detection light is incident.

The recombination layer is preferably constituted by a quantum well layer.

In the semiconductor light-detecting device of the present invention, a digital output can be obtained. Therefore, processes such as amplification of an output of the present invention and A/D conversion thereof which are required in a conventional device are not required.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view showing a phototransistor according to the first embodiment of the present invention;

FIG. 2 is an energy band diagram of the phototransistor of FIG. 1 in an OFF state;

FIG. 3 is an energy band diagram of the phototransistor of FIG. 1 in an ON state;

FIG. 11 is an energy band diagram of the photodiode of FIG. 10 in an OFF state;

FIG. 12 is an energy band diagram of the photodiode of FIG. 10 in an ON state;

FIG. 13 is a sectional view showing a photodiode according to the fifth embodiment of the present invention;

FIG. 21 is a diagram showing an application of a phototransistor according to the present invention;

FIG. 22 is a graph showing changes in voltage as a function of time for optical inputs having various intensities in the phototransistor of the present invention;

DETAILED DESCRIPTION OF THE PREFERRED EMBODIMENTS

Figure 4:
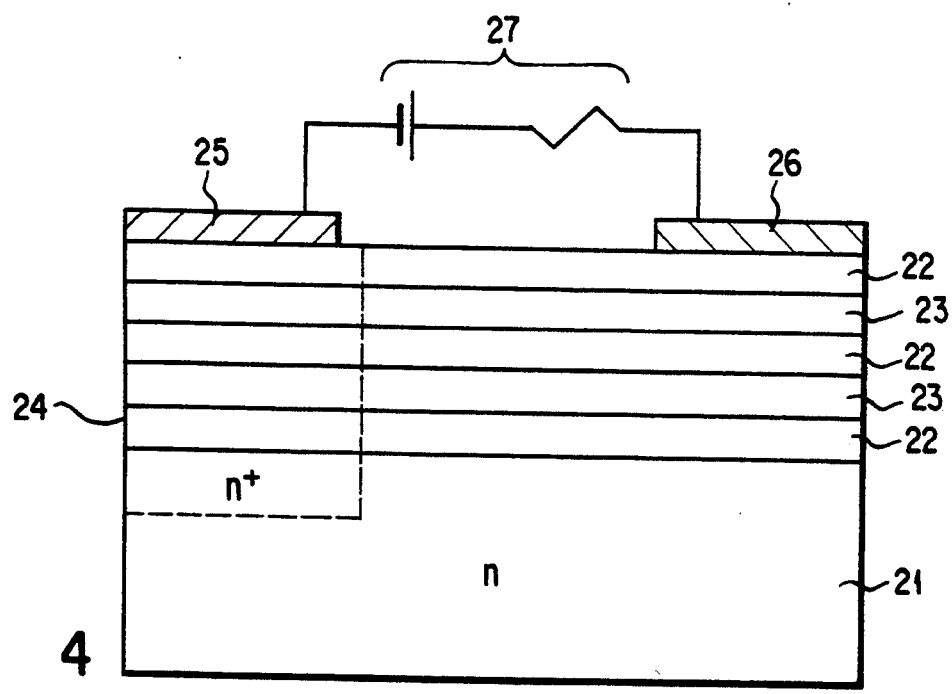
FIG. 4 is a sectional view showing a Schottky barrier photodiode according to the second embodiment of the present invention.

In a phototransistor according to the first embodiment in FIG. 1, an emitter layer 2 in which an n-type impurity is doped at a low concentration is formed on a substrate 1 consisting of a compound semiconductor in which an n-type impurity is doped at a relatively high concentration. A single or multiple quantum well layer 3 consisting of an intrinsic semiconductor and a base layer 4 in which a p-type impurity is doped at a low concentration are formed on the n-type emitter layer 2.

The single or multiple quantum well layer 3 (carrier recombination rate control layer) is formed on the emitter layer 2. Parameters such as the number of wells and the depth and width of the quantum well layer are selected such that a rate at which electrons injected from the emitter layer 2 to the quantum well layer 3 and holes injected from a collector layer 5 (to be described later) to the quantum well layer 3 are recombined with each other and disappear in an OFF state (inactive state) is much higher than that in an ON state (active state).

That is, a local electric field applied to a quantum well In the OFF state is greatly different from that in the ON state, and the parameters of the quantum well are selected such that the effect of the electric field on the quantum well, more particularly, a ratio of recombination caused by localization, is changed.

The collector layer 5 consisting of an intrinsic semiconductor or a semiconductor in which an impurity is doped at a low concentration, which can easily absorb detection light, is formed on the p-type base layer 4, and the collector layer 5 operates as a layer for absorbing detection light. A cap layer 6 consisting of a compound semiconductor which is optically transparent to detection light and in which an n-type impurity is doped at a relatively high concentration is formed on the collector layer 5. A cathode electrode 7 is formed on the cap layer 6, and an anode electrode 8 is formed on the lower surface of the substrate 1. That is, the substrate 1 and the cap layer 6 also operate as ohmic contact layers. A power supply 9 applies a bias voltage across the cathode electrode 7 and the anode electrode 8.

A semiconductor material having a band gap considerably larger than that of the quantum well layer 4 is used as the semiconductor material of the substrate 1, the emitter layer 2, the base layer 4, and the cap layer 6. The emitter layer 2, the quantum well layer 3, the base layer 4, the collector layer 5, and the cap layer 6 are continuously grown and formed by a growing method such as MOCVD.

FIG. 2 is an energy band diagram of the phototransistor having the above arrangement, and shows a state wherein light is not radiated on the collector layer 5, i.e., an inactive state. In this state, the collector layer 5 is completely depleted by the reverse bias voltage, and the base layer 4 operates as a high barrier against electrons $e_1$. For this reason, the inactive state, one having a high voltage and a small current, is maintained without causing the electrons $e_1$ to flow into the collector layer 5.

FIG. 3 is an energy band diagram in a state wherein light of sufficiently high intensity is radiated on the collector layer 5, i.e., an active state. When light 10 is radiated on the collector layer 5, pairs of electrons e and holes h are generated in the collector layer 5. The electrons e are forced by the extant electric field in the collector layer 5 established by the reverse bias voltage to flow into the cathode electrode 7, and are then exhausted from the device. Coincidentally, the holes h flow into the p-type base layer 4 and attract electrons $e_1$ in the emitter layer 2 toward the base layer. As a result, the height of the barrier is decreased, and a larger number of electrons $e_1$ supplied from the emitter layer 2 flow into the cathode electrode 7, thereby realizing an active state, one of lower voltage and larger current than that of the inactive state.

When light of insufficient intensity is radiated on the collector layer 5, i.e., a low level input state, holes h generated in the collector layer 5 are injected into the p-type base layer 4. Although part of the injected holes attract electrons $e_1$ toward the base layer 4 and decrease the height of the barrier of the base layer 4, most of them are injected into the quantum well layer 3, are recombined with the electrons supplied from the emitter layer 2 and extinguished. With this state, in spite of light input, the number of electrons flowing into the collector layer 5 from the emitter layer is small, and an inactive state, one of high voltage and low current, is maintained.

As the intensity of the light input increases and the number of the holes recombined in the quantum well layer 3 is increased up to a certain level, the number of electrons in the emitter layer attracted by the holes is increased. As a result, the strength of electric field applied to the quantum well layer 3 is lowered and the band structure of the quantum well layer 3 is changed by the light input of the certain level. At this time, the recombination rate of the carriers in the quantum well layer 3 is lowered and the number of the holes, which are recombined and extinguished, is abruptly decreased. Therefore, in this state, the holes injected into the base layer 4 attract electrons in the emitter layer 2 toward the base layer 4, so that an active state is established.

The change of the recombination rate in the quantum well layer 3 is attributed to the change of the band structure due to the electric field applied to the quantum well layer 3. When the strength of the electric field is great, i.e., when the band structure is deformed (inactive state), tunnel effect between bands becomes strong and the recombination rate of carriers is higher. On the contrary, when the strength of the electric field is small, i.e., when the band structure is planed (active state), the tunnel effect between the bands becomes weak and the recombination rate of carriers is lower than that of the active state.

When the irradiation of the light 10 on the collector layer 5 is stopped, the generation of the pairs of electrons e and holes h is stopped, and the holes h are not supplied to the base layer 4. For this reason, the height of the barrier of the base layer 4 is restored to the initial height, thereby setting an inactive state again. At this time, the rate at which the electrons e injected from the n-type emitter layer 2 to the quantum well layer 3 and the holes h injected from the collector layer 5 to the quantum well layer 3 are recombined with each other and disappear in the inactive state is much higher than that in the active state. For this reason, when the active state is switched to the inactive state, the electrons and holes in the quantum well layer 3 rapidly disappear. Therefore, the active state can be returned to the inactive state at a speed higher than that of a conventional device.

In addition, since the recombination rate of carriers in an inactive state is higher than that in an active state, a threshold value is established with respect to an optical input, as described above. Therefore, output characteristics which are nonlinear with respect to an optical input intensity can be obtained, and a digital output can be obtained. That is, an output circuit can be constituted solely by the device of the invention, acting as or a digital switch, without using either an analog amplifier or an A/D converter in an external electric circuit. In other words, according to this embodiment, when the quantum well layer 3 and the base layer 4 are used such that the rate at which electrons and holes are recombined with each other and disappear in the inactive state is different from that in the active state, a phototransistor having a switching time shorter than that of a conventional device and capable of directly obtaining a digital output can be obtained.

The materials of the layers are changed depending on the wavelength of detection light. When detection light having a large wavelength (1.0 to 1.6 μm in a free space) and generally used in optical fiber communication is used, for example, InP can be used as the material of the substrate 1, the emitter layer 2, and the cap layer 6, $In_{0.53}Ga_{0.47}As$ can be used as the material of the quantum well layer 3, $in_{0.65}Ga_{0.55}As_{0.79}P_{0.21}$ can be used as the material of the base layer 4 and $In_{0.53}Ga_{0.47}As$ or $In_{0.65}Ga_{0.35}As_{0.79}P_{0.21}$ can be used as the material of the collector layer 5. In a band having the above wavelength, GaAs may be used as the material of the substrate 1, the emitter layer 2, and the cap layer 6. A strained quantum well layer may be used in place of the quantum well layer 3.

In this embodiment, although the p-type base layer 4 having the quantum well layer 3 is used to cause a rate at which electrons and holes are recombined with each other and disappear in an active state to be different from that in an inactive state, another method may be used to realize the above effect.

EXPERIMENT 1

Samples of the phototransistor according to the first embodiment were manufactured in the following manner. That is, the substrate 1: n-type InP having a carrier concentration of about $1 \times 10^{18}$ cm$^{-3}$; the emitter layer 2: n-type InP having a carrier concentration of $1 \times 10^{17}$ cm$^{-3}$ and a thickness of 0.55 μm; the quantum well layer 3: undoped In$_{0.53}$Ga$_{0.47}$As having a thickness of about 5 to 15 nm and consisting of one well; the base layer 4: p$^-$-type In$_{0.65}$Ga$_{0.35}$As$_{0.79}$P$_{0.21}$ having a carrier concentration of $2 \times 10^{17}$ cm$^{-3}$ and a thickness of about 10 nm; the collector layer 5: undoped In$_{0.65}$Ga$_{0.35}$As$_{0.79}$P$_{0.21}$ having a thickness of about 2 μm; the cap layer 6: n-type InP having a carrier concentration of about $1 \times 10^{18}$ cm$^{-3}$ and a thickness of about 1 μm; and the electrodes 7 and 8: AuGe or AuSn.

When a reverse bias voltage of 5 V was applied to a sample including the quantum well layer 3 having a thickness of 10 nm, changes in device voltage over time for optical inputs having various constant intensities occurred and were measured. Each optical input was turned on at t=0, and was turned off at t=200 ps. The measurement results are shown in FIG. 22. In FIG. 22, the optical input intensities are indicated by adding the values to corresponding characteristic curves. In FIG. 22, a decrease in device voltage means that a current flows in the device to set the device in an ON state. As is apparent from FIG. 22, it is understood that a speed at which an active state is returned to an inactive state, i.e., an OFF state is very high in the phototransistor of the present invention.

Figure 23:
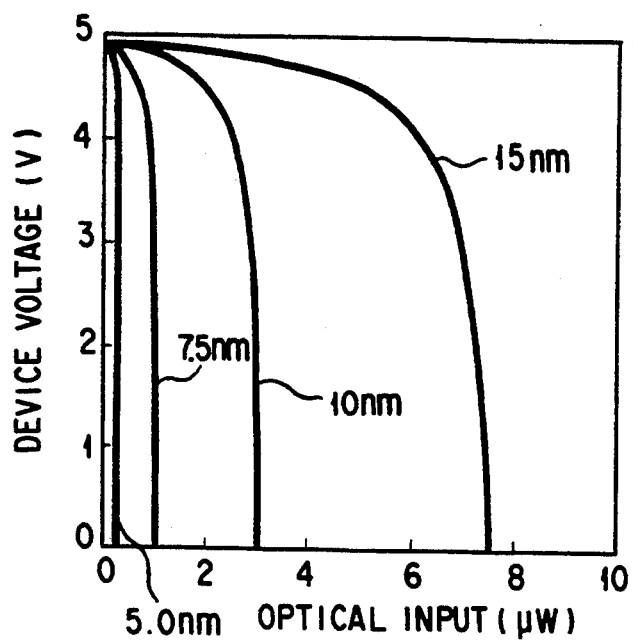
FIG. 23 is a graph showing changes in voltage as a function of changes in intensity of an optical input in the phototransistor of the present invention.

A reverse bias voltage of 5 V was applied to each of samples which include the quantum well layers 3 having thicknesses of 5.0, 7.5, 10, and 15 nm, respectively, and changes in voltage as a function of changes in intensity of an optical input occurred and were measured. The measurement results are shown in FIG. 23. In FIG. 23, the thicknesses of the layers 3 are indicated by adding the values to corresponding characteristic curves. As is apparent from FIG. 23, a current begins to abruptly flow at a predetermined optical input intensity (a voltage is decreased) in each of the characteristic curves, and the phototransistor of the present invention has a substantial existent threshold value.

Figure 24:
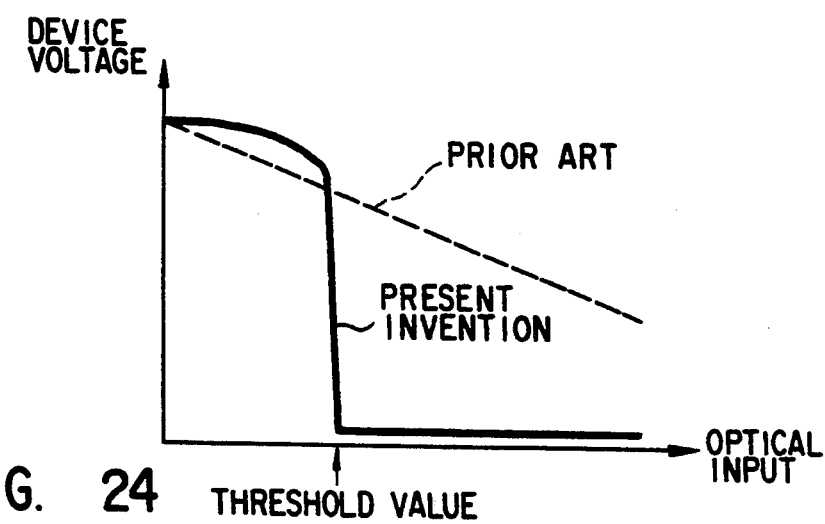
FIG. 24 is a graph showing changes in voltage as a function of changes in intensity of an optical input to compare the phototransistor of the present invention with the conventional phototransistor.
Figure 25:
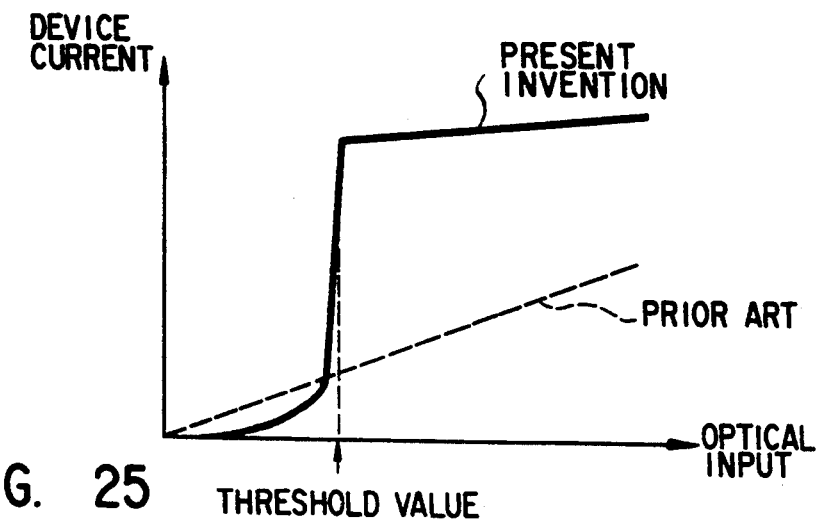
FIG. 25 is a graph showing changes in current as a function of changes in intensity of an optical input to compare the phototransistor of the present invention with the conventional phototransistor.

This point is to be clarified with reference to FIGS. 24 and 25. As shown in FIGS. 24 and 25, a decrease in voltage or an increase in current occurs as a function of a change in intensity of an optical input, but that an output is linear in the prior art, while that an output is nonlinear in the present invention. That is, in the phototransistor of the present invention, a digital output can be obtained. Therefore, as shown in FIG. 21, an output circuit can be arranged solely by the present invention, acting as a digital switch, without using an amplifier AMP 97 and an A/D converter 98 which are required in the prior art.

FIG. 4 is a view showing the arrangement of a Schottky barrier photodiode according to the second embodiment of the present invention.

Semiconductor light-absorbing layers 23 and compound semiconductor layers 22 each having a band gap larger than that of each of the semiconductor light-absorbing layers 23 are alternately formed on the surface portion of an n-type semiconductor substrate 21. The lowermost and uppermost layers are the compound semiconductor layers 22. That is, each of all the semiconductor light-absorbing layers 23 is formed to be interposed between the layers 22. A material optically transparent to detection light is used as the material of the compound semiconductor layers 22.

A heavily doped n-type semiconductor region 24 is formed on the surface of the n-type semiconductor substrate 21. The n-type semiconductor region 24 can be formed such that an n-type impurity is introduced in the substrate surface by a diffusion method or ion implantation after the semiconductor light-absorbing layers 23 and the layers 22 are formed. At this time, the concentration distribution of the n-type impurity is uniform in the semiconductor light-absorbing layers 23 and the layers 22.

An anode electrode 25 is formed on the surface of the high-concentration n-type semiconductor region 24, and a cathode electrode 26 is formed on the surface of uppermost layer 22. That is, an ohmic contact is formed in the heavily doped n-type semiconductor region 24, and a Schottky contact is formed in the layer 22. A power supply 27 applies a bias voltage across the anode electrode 25 and the cathode electrode 26.

Figure 5:
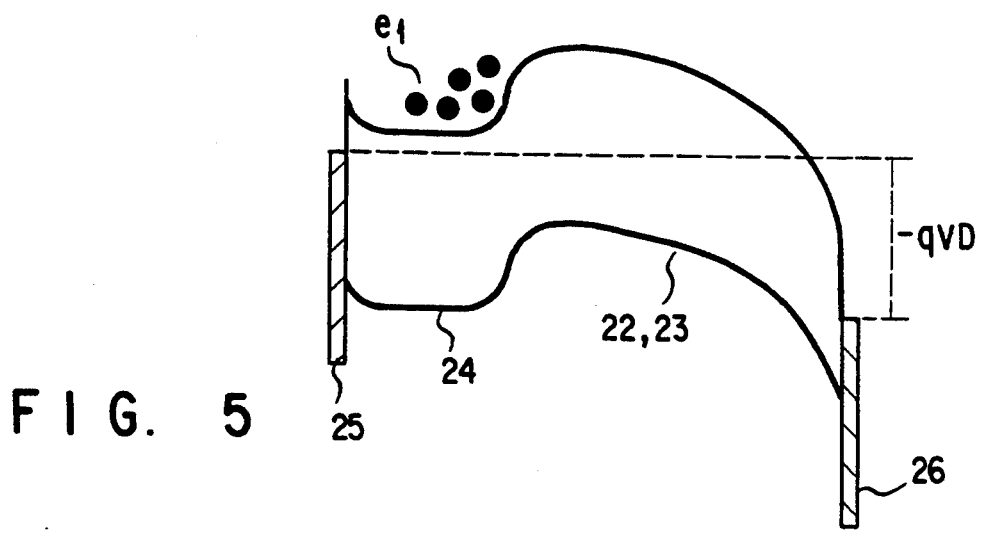
FIG. 5 is an energy band diagram of the Schottky barrier photodiode of FIG. 4 in an OFF state.

FIG. 5 is an energy band diagram of the Schottky barrier photodiode arranged as described above, and shows a case wherein light is not radiated on the light-absorbing layers 23. In this state, a barrier is formed between the n-type semiconductor region 24 and the multilayered structure consisting of the layers 22 and 23. For this reason, electrons e1 in the n-type semiconductor region 24 are prevented by the barrier from flowing into the cathode electrode 26, an OFF state, one having a high voltage and a small current, is maintained.

Figure 6:
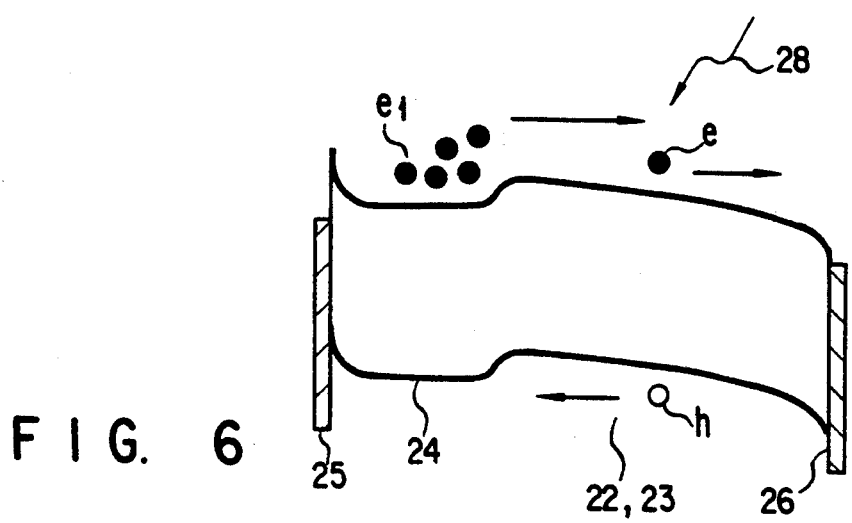
FIG. 6 is an energy band diagram of the Schottky barrier photodiode of FIG. 4 in an ON state.

FIG. 6 is an energy band diagram in a case wherein light is radiated on the light-absorbing layers 23. When light 28 is radiated on each of the light-absorbing layers 23, pairs of electrons e and holes h are generated in the layers 23. The electrons e flow into the cathode electrode 26 by a Schottky barrier ($-qV_D$: $-q$ is the charge of electrons and $V_D$ is the voltage of the cathode electrode 26) formed on the cathode electrode 26 side, and the holes h flow into the anode electrode 25. As a result, the height of the barrier is decreased, the large number of electrons e1 accumulated in the n-type semiconductor region 24 flow into the cathode electrode 26, and an active state, one having a low voltage and a large current, is realized.

Since each of the light-absorbing layers 23 is interposed between the compound layers 22, each having an energy band gap larger than that of the light-absorbing layers 23, the light-absorbing layers 23 operate individually as channels for current. For this reason, since the electrons e1 flow while being confined within a potential well, the electrons e1 are not easily influenced by scattering by impurities or the like in a crystal. Therefore, compared with a conventional device, device characteristics such as the current gain of the present invention are improved, and high-speed operation can be performed in the device of the present invention even when the device characteristics such as the current gain are increased.

When the irradiation of the light 28 on the light-absorbing layers 23 is stopped, the height of the Schottky barrier is restored to the initial height ($-qV_D$) because generation of the pairs of electrons e and holes h in the layer 23 is stopped, thereby setting an OFF state again. The ON/OFF operations performed by the control of the Schottky barrier using the light 28 can be realized by selecting the thicknesses of the layers 22 and 23 and the number of the layers 22 and 23.

Figure 7:
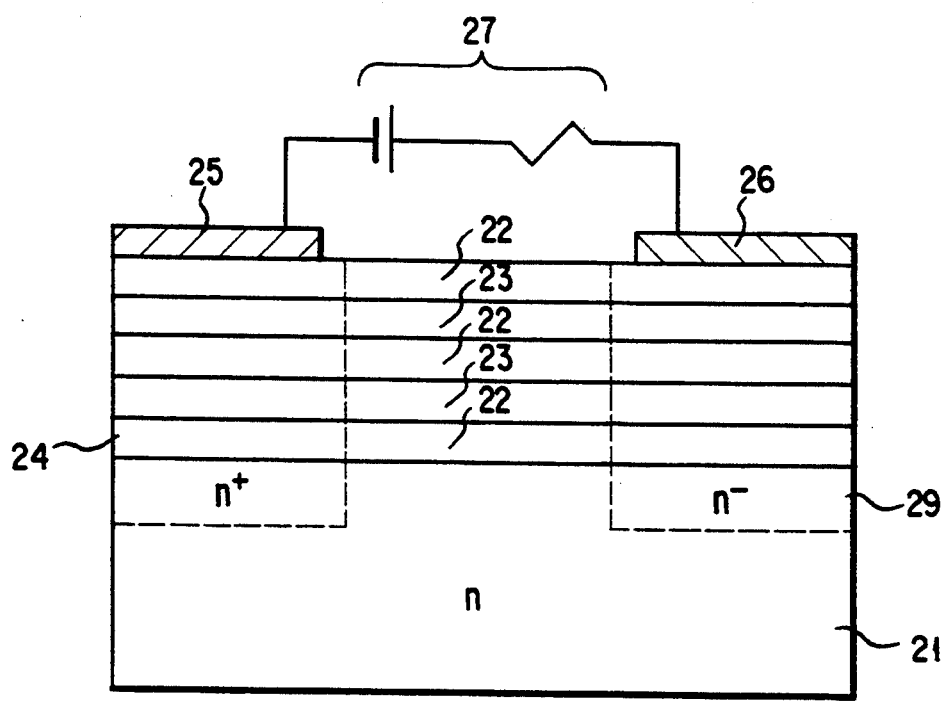
FIG. 7 is a sectional view showing a modification of the Schottky barrier photodiode of FIG. 4.

As shown in FIG. 7, a Schottky contact may be formed such that a low-concentration n-type semiconductor region 29 is formed on the surface of the substrate, and a cathode electrode 18 is formed on the n-type semiconductor region 29.

Figure 8:
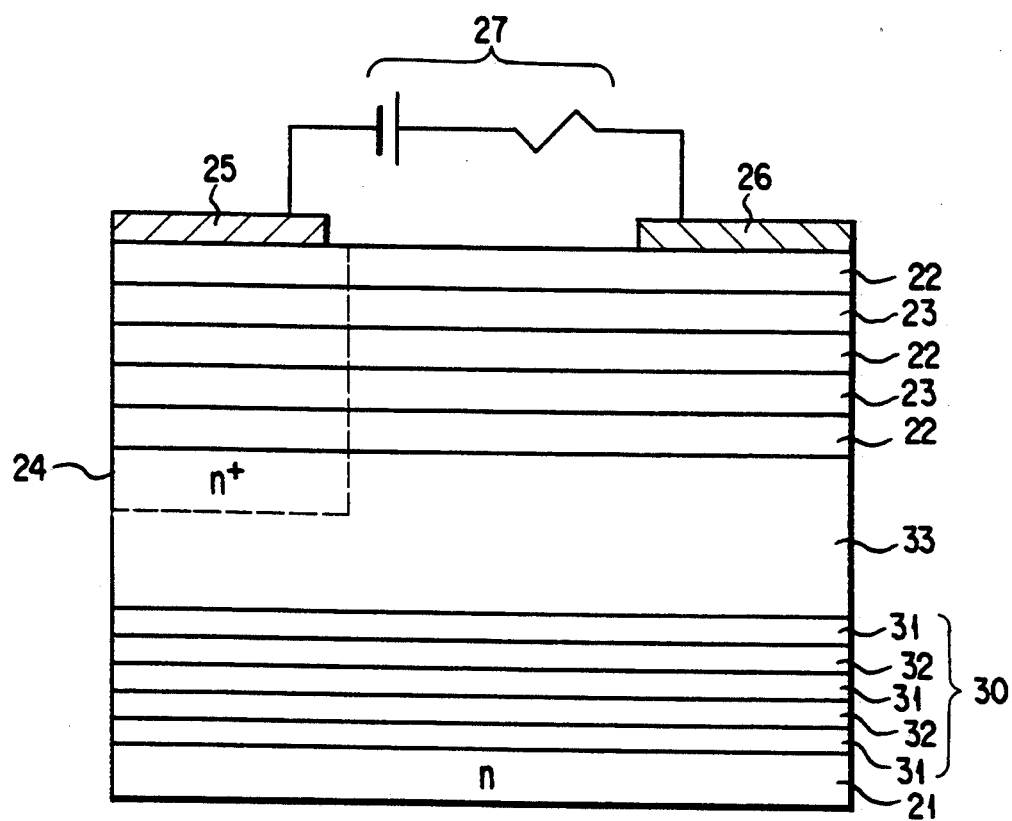
FIG. 8 is a sectional view showing a Schottky barrier photodiode according to the third embodiment of the present invention.

FIG. 8 is a view showing the arrangement of a Schottky barrier photodiode according to the third embodiment of the present invention. The same reference numerals as in FIG. 4 denote parts corresponding to the parts of the Schottky barrier photodiode in FIG. 4, and a detailed description thereof will be omitted.

The Schottky barrier photodiode of this embodiment is different from that of the previous embodiment in the following points. That is, a multilayered reflection structure 30 obtained by alternately stacking first reflection mirrors 31 and second reflection mirrors 32 is formed on an n-type semiconductor substrate 21, and the device structure in FIG. 4 is formed on an n-type semiconductor separation layer 33 on the multilayered reflection structure 30.

The refractive index of each of the first reflection mirrors 31 is different from the refractive index of each of the second reflection mirrors 32. Each of the thicknesses of the first and second reflection mirrors 31 and 32 is ¼ the wavelength of detection light. That is, the thicknesses of the first and second reflection mirrors 31 and 32 are selected such that the multilayered reflection structure 30 operates as a Bragg reflection mirror.

In the Schottky barrier photodiode arranged as described above, the same effect as in the previous embodiment can be obtained. In addition, in this embodiment, light which is incident on the substrate surface and is not absorbed by the light-absorbing layers 23 is reflected by the substrate surface side of the multilayered reflection structure 30, and is incident on the light-absorbing layers 23 again. At this time, light which is not absorbed by the light-absorbing layers 23 is reflected by the substrate surface, and is incident on the light-absorbing layers 23 again. Since the above reflecting operations are repeated, the Schottky barrier photodiode having a current gain higher than that of the previous embodiment can be obtained.

Figure 9:
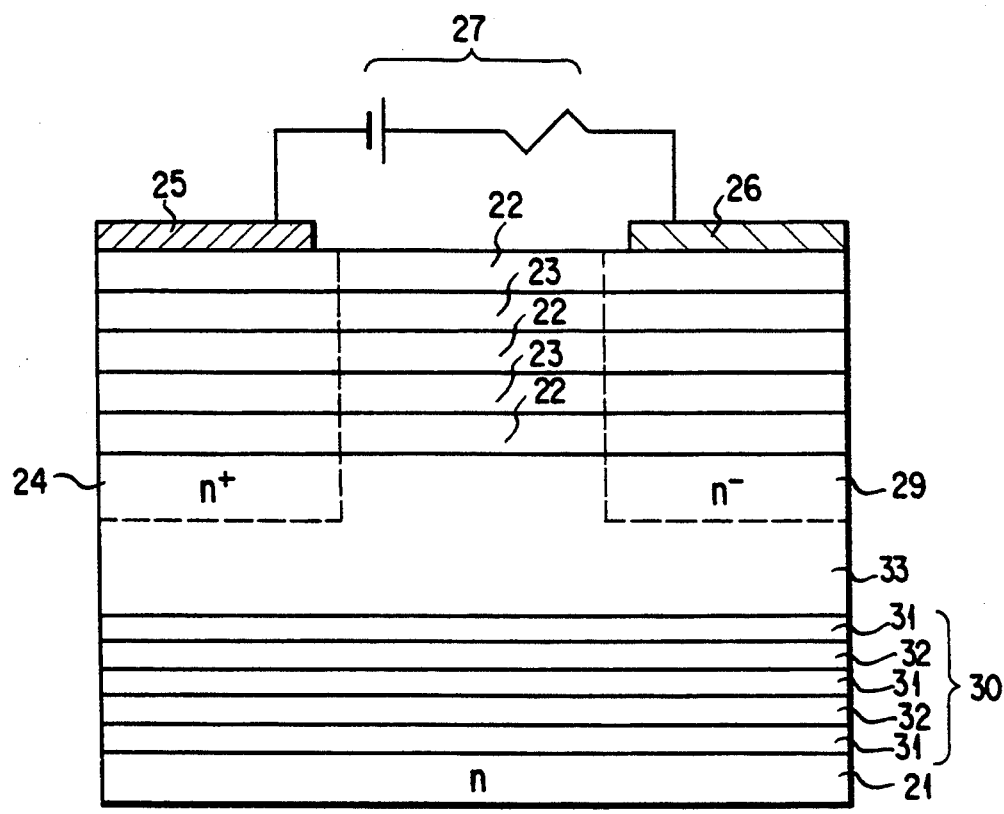
FIG. 9 is a sectional view showing a modification of the Schottky barrier photodiode in FIG. 8.

In this embodiment, as shown in FIG. 9, a Schottky contact may be formed by forming a lightly doped n-type semiconductor region 29 and forming a cathode electrode 26 thereon.

Figure 10:
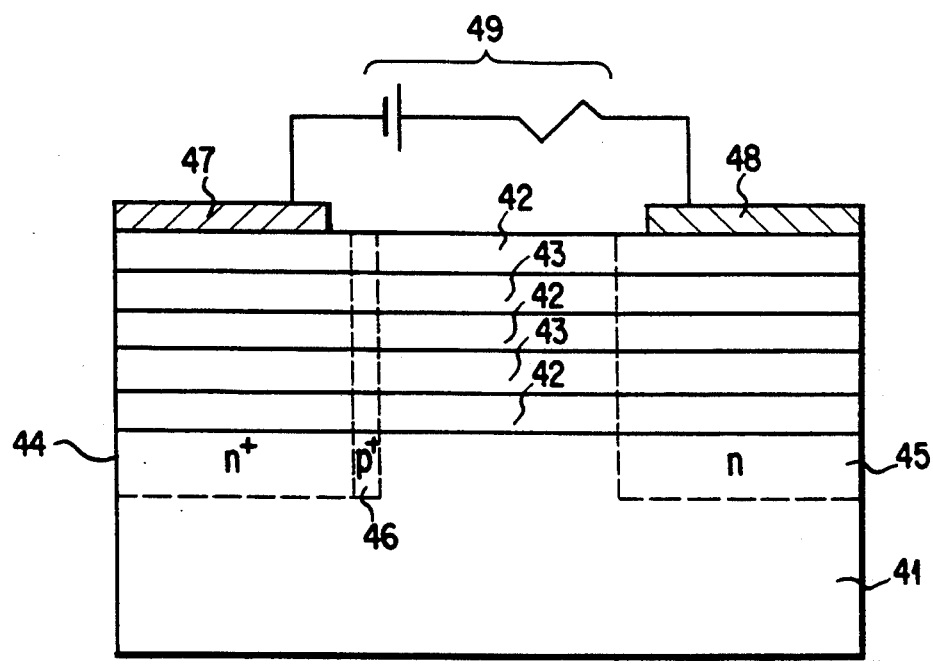
FIG. 10 is a sectional view showing a photodiode according to the fourth embodiment of the present invention.

FIG. 10 is a view showing the arrangement of a photodiode according to the fourth embodiment of the present invention.

Semiconductor light-absorbing layers 43 consisting of GaInAs or the like and compound semiconductor layers 42 each having a band gap larger than that of each of the semiconductor light-absorbing layers 43 are alternately formed on a surface portion of an n-type semi-insulating semiconductor substrate 41. Each of all the light-absorbing layers 43 is interposed between the layers 42. A material optically transparent to detection light is used as the material of the compound semiconductor layers 42. InP, GaInAs, and AlInAs or the like are used as the materials of the substrate 41, the layer 42, and the layer 43, respectively.

A heavily doped n-type semiconductor region 44, an n-type semiconductor region 45, and a heavily doped p-type semiconductor region 46 are formed on the substrate surface. The region 46 is formed on one side-surface of and contiguous to the region 44 opposite to the region 45 to have a small thickness.

The n-type semiconductor regions 44 and 45 and the p-type semiconductor region 46 are formed by introducing an n-type impurity and a p-type impurity in the substrate surface by a diffusion method or ion implantation after the light-absorbing layers 43 and the layers 42 are formed. At this time, the concentration distribution of the n-type impurity in the region 44 is uniform in the layers 42 and 43. Similarly, the concentration distribution of the n-type impurity in the region 45 and the concentration distribution of the p-type impurity in the region 46 are uniform in the layers 43 and 42.

An anode electrode 47 and a cathode electrode 48 which are in ohmic contact with each other are formed on the surfaces of the regions 44 and 45, respectively. That is, the anode electrode 47 and the cathode electrode 48 establish ohmic contacts on the surfaces of the regions 44 and 45, respectively. A power supply 49 applies a reverse bias voltage across the anode electrode 47 and the cathode electrode 48.

FIG. 11 is an energy band diagram of the photodiode arranged as described above, and shows a case wherein light is not radiated on the semiconductor light-absorbing layer 43. In this state, a depletion layer is formed in the high-concentration p-type semiconductor region 46, and the region 46 operates as a barrier against electrons $e_1$. For this reason, an OFF state, one having a high voltage and a small current, is maintained, and the electrons $e_1$ are prevented from flowing into the cathode electrode 48. In this embodiment, since the barrier is formed by the region 46, a barrier which is stabler than that of the Schottky barrier photodiode in the previous embodiment can be advantageously obtained.

FIG. 12 is an energy band diagram in a case wherein light 50 is radiated on the semiconductor light-absorbing layers 43. When the light 50 is radiated on the layers (i in FIG. 12), pairs of electrons e and holes h are generated in the layers 43. The electrons e are forced to flow into the cathode electrode 48 and are then exhausted from the device. Coincidentally, the holes h flow into the region 46, decreasing the width of the depletion layer formed in the region 46. As a result, the height of the barrier is decreased, and a larger number of electrons $e_1$ accumulated in the substrate 41 flow into the cathode electrode 48, thereby obtaining an ON state having a low voltage and a large current.

At this time, since each of the light-absorbing layers 43 is interposed between the compound layers 42, the light-absorbing layers 43 operate individually as channels for current. For this reason, since the electrons $e_1$ flow while being confined within a potential well, the electrons $e_1$ are not easily influenced by scattering by impurities or the like in the crystal, and device characteristics such as current gain are improved compared with those of a conventional device.

When the irradiation of the light 50 on the light-absorbing layers 43 is stopped, the generation of the pairs of electrons e and holes h in the layers 43 is stopped, and the height of the barrier of the p-type semiconductor region 46 is restored to the initial height, thereby setting an OFF state again. The ON/OFF operations performed by controlling the barrier of the region 46 using the light 50 can be realized by properly selecting the thicknesses of the layers 43 and 42 and the number of the layers 43 and 42.

FIG. 13 is a view showing the arrangement of a photodiode according to the fifth embodiment of the present invention. The same reference numerals as in FIG. 10 denote parts corresponding to the parts of the photodiode in FIG. 10, and a detailed description thereof will be omitted.

The photodiode of this embodiment is different from that of the previous embodiment in the following points. That is, a multilayered reflection structure 53 obtained by alternately stacking first reflection mirrors 51 and second reflection mirrors 52 is formed on an n-type semiconductor substrate 41, and the device structure in FIG. 10 is formed on an i-type semiconductor separation layer 54 formed on the multilayered reflection structure 53.

The refractive index of each of the first reflection mirrors 51 is different from the refractive index of each of the second reflection mirrors 52. Each of the thicknesses of the first and second reflection mirrors 51 and 52 is ¼ the wavelength of detection light. That is, the thicknesses of the first and second reflection mirrors 51 and 52 are selected such that the multilayered reflection structure 53 operates as a Bragg reflection mirror.

In the photodiode arranged as described above, the same effect as in the previous embodiment can be obtained. In this embodiment, since the multilayered reflection structure 53 is used, light which is incident from the substrate surface can be effectively used, a Schottky barrier photodiode having a higher current gain can be obtained.

Figure 14:
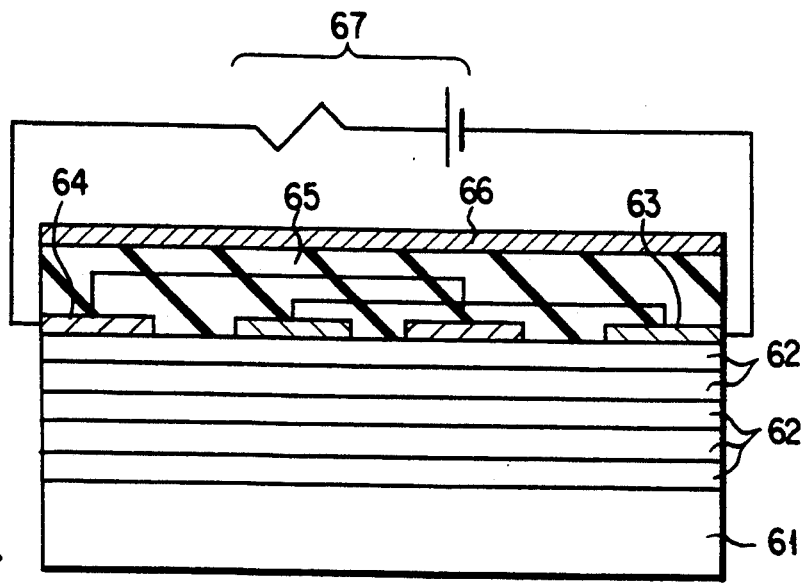
FIG. 14 is a sectional view showing an avalanche photodiode according to the sixth embodiment of the present invention.

FIG. 14 is a view showing the arrangement of an avalanche photodiode according to the sixth embodiment of the present invention.

Figure 15:
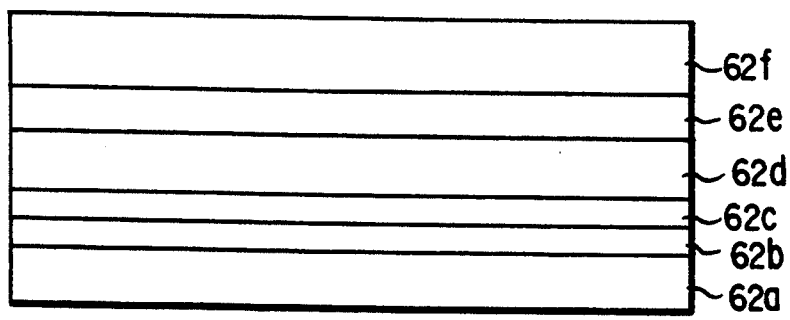
FIG. 15 is a sectional view showing the arrangement of a unit avalanche layer of the avalanche photodiode in FIG. 14.

A plurality of unit avalanche layers 62 consisting of a compound semiconductor are formed on a semi-insulating semiconductor substrate 61. Each of the unit avalanche layers 62, as shown in FIG. 15, has a structure obtained by stacking a p-type semiconductor layer 62a having a large band gap, an undoped semiconductor layer 62b having a large band gap, an undoped semiconductor layer 62c having a small band gap, an n-type semiconductor layer 62d having a small band gap, an undoped semiconductor layer 62e having a small band gap, and an undoped semiconductor layer 62f having a large band gap. The layers 62a to 62f are sequentially grown and formed by a growing method such as MOCVD.

As to the materials of the layers 62a to 62f, materials which easily absorb detection light are used. The carrier concentrations and thicknesses of the layers 62a to 62f are selected such that the impact ionization coefficient of electrons is set to be considerably larger than that of holes. The impact ionization coefficient of electrons is set to be large because multiplication noise is reduced when carriers of a single type are used. The electron ionization coefficient of a III-V compound semiconductor material which is optimally used in fields of communication, information processing, and the like is generally smaller than the hole ionization coefficient of the III-V compound semiconductor material. However, since the unit avalanche layers 62 are used in this embodiment, the electron ionization coefficient can easily be increased.

A plurality of anode electrodes 63 which are electrically connected to each other and a plurality of cathode electrodes 64 which are electrically connected to each other are formed on the uppermost unit avalanche layer 62. The anode electrodes 63 and the cathode electrodes 64 are covered with an insulating cap layer 65, and the surface of the insulating cap layer 65 is coated with a metal film 66. A power supply 67 applies a reverse bias voltage across the anode electrodes 63 and the cathode electrodes 64.

The geometrical characteristics such as shapes and arrangements of the anode electrodes 63 and the cathode electrodes 64 and the voltage levels of the anode electrodes 63, the cathode electrodes 64, and the power supply 67 are selected such that the electric field required for avalanche multiplication is effectively applied to the electrons and holes generated in the unit avalanche layers 62.

When light is incident from the surface (lower side in FIG. 14) of the semi-insulating semiconductor substrate 61 on the unit avalanche layers 62, pairs of primary electrons and holes are generated. When the electrons and holes collide with the atoms of the unit avalanche layers 62 to generate pairs of secondary electrons and holes, electrons are preferentially generated by collision ionization of the secondary electrons and holes, and a current flows between the cathode electrodes 64 and the anode electrodes 63, thereby setting an ON state.

When the incidence of light on the unit avalanche layers 62 is stopped, the generation of the pairs of primary electrons and holes is stopped, and a current easily flows between the cathode electrodes 64 and the anode electrodes 63, thereby setting an OFF state. Since the geometrical characteristics such as shapes and arrangements of the anode electrodes 63 and the cathode electrodes 64 are selected such that an electric field required for avalanche multiplication is effectively applied to the electrons and holes, the distance between the region in which the primary electrons and holes are generated and the region in which the secondary electrons and holes are generated is shorter than that of a conventional photodiode, and the primary and secondary electrons and holes are accelerated at a higher speed in the direction of the anode electrodes 63 and the cathode electrodes 64. For this reason, when the generation of the primary electrons and holes is stopped, electrons and holes left in the device are quickly exhausted, and switching to an OFF state can be performed at a speed higher than that of the conventional photodiode.

Although the material of the semiconductor substrate 61, the material of the semiconductor layers 62a, 62b, and 62f each having a large band gap, and the material of the semiconductor layers 62c, 62d, and 62e each having a small band gap are changed depending on the wavelength of detection light, when detection light having a large wavelength (1.0 to 1.6 μm in a free space) generally used in an information network or the like, for example, InP is used as the material of the semiconductor substrate 61, AlInAs can be used as the material of the semiconductor layers 62a, 62b, and 62f, and $In_{0.53}Ga_{0.47}As$ can be used as the material of the semiconductor layers 62c, 62d, and 62e. In addition, $Si_3N_4$ or $SiO_2$ can be used as the material of the insulating cap layer 65.

Figure 16:
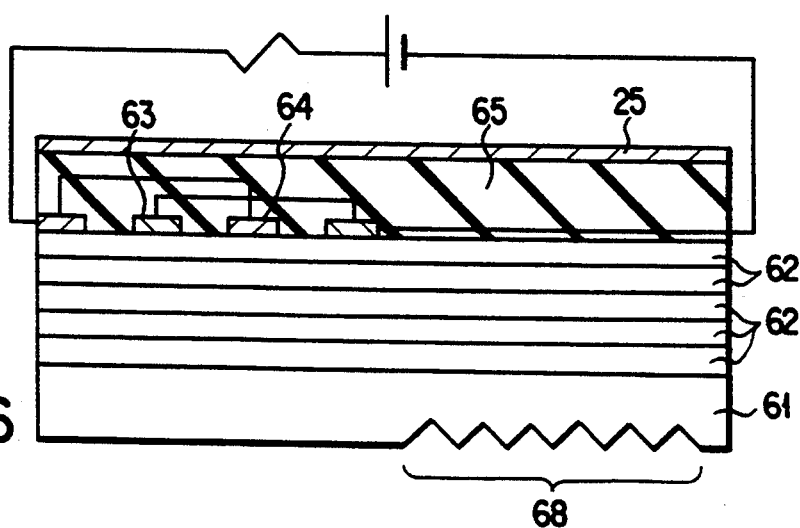
FIG. 16 is a sectional view showing an avalanche photodiode according to the seventh embodiment of the present invention.
Figure 17:
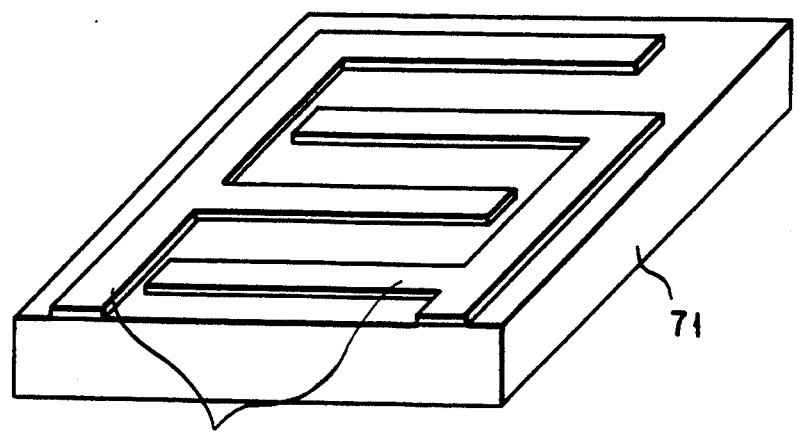
FIG. 17 is a perspective view showing a conventional photoconductor.
Figure 18:
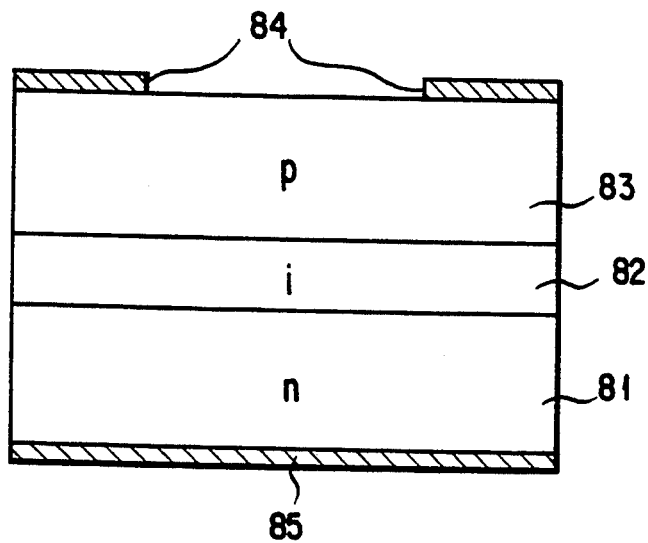
FIG. 18 is a sectional view showing a conventional pin photodiode.
Figure 19:
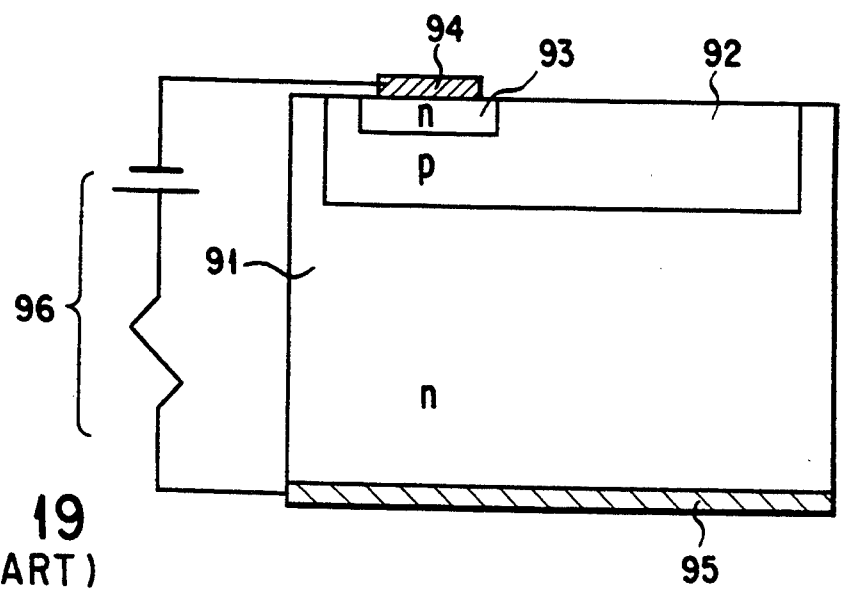
FIG. 19 is a sectional view showing a conventional phototransistor.
Figure 20:
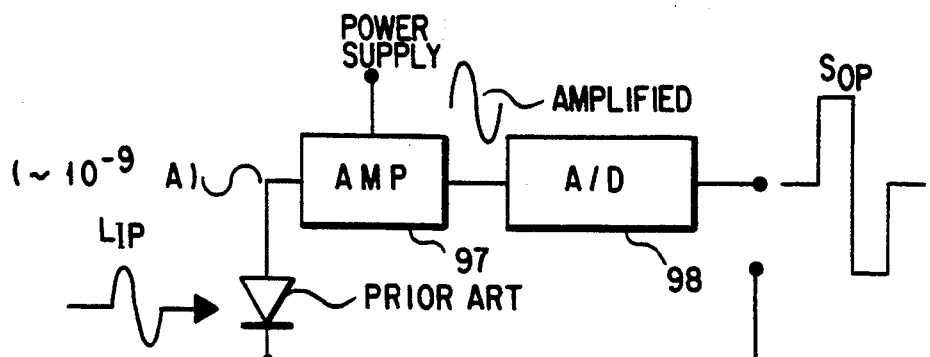
FIG. 20 is a diagram showing an application of a conventional phototransistor.

FIG. 16 is a schematic view showing the arrangement of an avalanche photodiode according to the seventh embodiment of the present invention. The same reference numerals as in FIG. 14 denote parts corresponding to the parts of the avalanche photodiode in FIG. 14, and a detailed description thereof will be omitted.

The avalanche photodiode of this embodiment is different from that of the previous embodiment in the following point. That is, a diffraction grating 68 is formed on the lower surface of a substrate at the ends of an anode electrode 64 and a cathode electrode 65. The diffraction grating 68 is formed by etching.

When the diffraction grating 68 is formed, incident light which is not absorbed by unit avalanche layers 62 is reflected in the direction of the anode electrode 64 and the cathode electrode 65. For this reason, quantum absorption efficiency is improved, and a current amplification factor larger than that of the previous embodiment can be obtained.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
    a first layer essentially consisting of a semiconductor of a first conductivity type;
    a semiconductor recombination layer, joined to said first layer, for controlling a recombination rate of carriers;
    a second layer essentially consisting of a semiconductor of a second conductivity type and joined to said recombination layer on a side opposite to said first layer;
    a third layer essentially consisting of one of a semiconductor of the first conductivity type and an intrinsic semiconductor and joined to said second layer on a side opposite to said recombination layer, said third layer operating as a layer for absorbing detection light;
    a first electrode connected to said first layer;
    a second electrode connected to said third layer; and
    a power supply for applying a reverse bias voltage across said first and second electrodes,
    wherein a rate at which carriers of a first polarity injected from said first layer to said recombination layer and carriers of a second polarity injected from said third layer to said recombination layer are recombined with each other and disappear in a state wherein the detection light is not incident is higher than that in a state wherein the detection light is incident.

2. A device according to claim 1, wherein said recombination layer comprises a quantum well layer essentially consisting of an intrinsic semiconductor.

3. A device according to claim 2, wherein said quantum well layer is constituted by a multiple quantum well layer.

4. A device according to claim 2, wherein said first layer essentially consists of one selected from the group consisting of InP and GaAs, said quantum well layer essentially consists of InGaAs, said second layer essentially consists of InGaAsP, and said third layer essentially consists of one selected from the group consisting of InGaAs and InGaAsP.

5. A device according to claim 4, wherein a wavelength of the detection light is 1.0 to 1.6 $\mu$m in free space, said first layer essentially consists of InP, said quantum well layer essentially consists of $In_{0.35}Ga_{0.47}As$, and said second and third layers essentially consist of $In_{0.65}Ga_{0.35}As_{0.79}P_{0.21}$.

6. A semiconductor phototransistor comprising:
    an emitter layer essentially consisting of a semiconductor of a first conductivity type;
    a semiconductor recombination layer, joined to said emitter layer, for controlling a recombination rate of carriers;
    a base layer essentially consisting of a semiconductor of a second conductivity type and joined to said recombination layer on a side opposite to said emitter layer;
    a collector layer essentially consisting of one of a semiconductor of the first conductivity type and an intrinsic semiconductor and joined to said base layer on a side opposite to said recombination layer, said collector layer operating as a layer for absorbing detection light;
    an emitter electrode connected to said emitter layer;
    a collector electrode connected to said collector layer; and
    a power supply for applying a reverse bias voltage across said emitter and collector electrodes,
    wherein a rate at which carriers of a first polarity injected from said emitter layer to said recombination layer and carriers injected from said collector layer to said recombination layer are recombined with each other and disappear in a state wherein the detection light is not incident is higher than that in a state wherein the detection light is incident.

7. A device according to claim 6, wherein said recombination layer comprises a quantum well layer essentially consisting of an intrinsic semiconductor.

8. A device according to claim 7, wherein said quantum well layer is constituted by a multiple quantum well layer.

9. A device according to claim 7, further comprising a cap layer joined to said collector layer on a side opposite to said base layer, said cap layer essentially consisting of a semiconductor in which an impurity of the first conductivity type is doped at a high concentration and which is optically transparent to the detection light, said collector electrode being in contact with said cap layer, and the detection light being incident on said collector layer through said cap layer.

10. A device according to claim 9, further comprising a semiconductor connection layer joined to said emitter layer on a side opposite to said quantum well layer, said connection layer essentially consisting of a semiconductor in which an impurity of the first conductivity type is doped at a high concentration, and said emitter electrode being in contact with said connection layer.

11. A device according to claim 10, wherein said connection layer is constituted by a semiconductor substrate.

12. A device according to claim 11, wherein said emitter layer, said quantum well layer, said base layer, said collector layer, said cap layer, and said collector electrode are stacked on said substrate in the order named, and said emitter electrode is formed on said substrate on a side opposite to said emitter layer.

13. A device according to claim 10, wherein a support layer, said emitter layer, and a cap layer essentially consist of one selected from the group consisting of InP and GaAs, said quantum well layer essentially consists of InGaAs, said base layer essentially consists of InGaAsP, and said collector layer essentially consists of one selected from the group consisting of InGaAs and InGaAsP.

14. A device according to claim 13, wherein a wavelength of the detection light is 1.0 to 1.6 $\mu$m in free space, said support layer, said emitter layer, and said cap layer essentially consist of InP, said quantum well layer essentially consists of $In_{0.53}Ga_{0.47}As$, and said base layer and said collector layer essentially consist of $In_{0.65}Ga_{0.35}As_{0.79}P_{0.21}$.

* * * * *